United States Patent [19]

McAdams

[11] Patent Number: 5,117,426
[45] Date of Patent: May 26, 1992

[54] CIRCUIT, DEVICE, AND METHOD TO DETECT VOLTAGE LEAKAGE

[75] Inventor: Hugh P. McAdams, Houston, Tex.

[73] Assignee: Texas Instruments Incorporated, Dallas, Tex.

[21] Appl. No.: 499,131

[22] Filed: Mar. 26, 1990

[51] Int. Cl.⁵ .......................................... G11C 29/00
[52] U.S. Cl. ...................................... 371/214; 365/201
[58] Field of Search ................... 371/21.4; 365/201; 324/522, 523

[56] References Cited

U.S. PATENT DOCUMENTS

| | | | |
|---|---|---|---|
| 4,412,327 | 10/1983 | Fox et al. | 371/21.4 |
| 4,416,057 | 11/1983 | Tardy | 324/523 |
| 4,672,501 | 6/1987 | Bilac et al. | 365/201 |
| 4,692,900 | 9/1987 | Ooami et al. | 365/201 |
| 4,720,818 | 1/1988 | Takeguchi | 365/201 |
| 4,905,194 | 2/1990 | Ohtsuka et al. | 365/201 |

*Primary Examiner*—Jerry Smith
*Assistant Examiner*—Henry C. Lebowitz
*Attorney, Agent, or Firm*—Robby T. Holland; Rene' E. Grossman; Richard L. Donaldson

[57] ABSTRACT

In memory devices, and particularly in dynamic random access memory devices that use boosted word lines, voltage leakage in word lines and transfer gates to memory cells cause data error. A circuit, device, and method to detect voltage leakage is disclosed. The test circuit includes a sample and hold circuit that is connected to the word line of an addressed memory cell to store the voltage level on the word lines as it charges. A comparator is connected to compare the stored voltage level with the voltage level on the word line after it is charged and to indicate if the voltage level of the word line falls below a predetermined amount. The circuit can detect a voltage differential as small as 50 millivolts for a high resistance short as large as 2 megaohms in about 200 nanoseconds. The circuit can be incorporated into a random access memory device thereby significantly increasing the speed at which all memory cells and word lines can be tested. The method disclosesd a process for testing word line to memory cell leakage.

11 Claims, 3 Drawing Sheets

CIRCUIT, DEVICE, AND METHOD TO DETECT VOLTAGE LEAKAGE

FIELD OF THE INVENTION

This invention is in the field of integrated circuits, and is more specifically directed to circuits relating to word lines in Dynamic Random Access Memory devices (DRAMs).

BACKGROUND OF THE INVENTION

In producing and manufacturing memory devices such as DRAMs, a production test usually occurs whose purpose is to ensure that a memory cell in the array can receive and hold data. It is typical to test the DRAM by operating it at a long Row Address Strobe (RAS) cycle time, such a RAS cycle of 10 microseconds, and attempting to write data of a voltage logic level "1" into an addressed memory cell towards the end of the RAS cycle. In a good DRAM, the logic level "1" can be written into the addressed memory cell and will remain there so that it is read when that memory cell is next addressed. As the DRAM size increases, from 1 megabit to 4 megabit, and to VLSI DRAMs of 16 megabits (where more than 16 million memory cells are contained on a single DRAM chip), the time it takes to perform this test for the entire DRAM array increases. For instance, in a 16 megabit DRAM operating on a RAS cycle of 10 microseconds, it takes approximately 160 seconds to access every memory cell. This large amount of time to test every DRAM is unacceptable in a production enviornment manufacturing numerous DRAMs.

Exemplary of the type of defect the above test reveals is voltage leakage. Voltage leakage can prevent the the logic "1" from being written into the memory cell. Leakage can also cause the data stored in the memory cell at the logic "1" level to decrease so that the addressed memory cell contains incorrect data.

An oxide defect in a transfer transistor that connects a storage capacitor to a bit line is an example of one type of leakage yielding defect that may occur in a DRAM. Another type of leakage yielding defect that may occur is a high resistance polyfilament short between two word lines. If the resistance is large, for example on the order of about 2 megaohms and higher, it may take quite a bit of time for the short to exhibit itself as voltage on the word line gradually leaks away.

It is known in the art for DRAM design that boosted wordlines advantageously increase the charge stored on the storage capacitors. DRAMs having boosted wordlines are described in U.S. Pat. Nos. 4,533,834 and 4,748,349, both to McAlexander, White, and Rao and both assigned to Texas Instruments Incorporated. These 64K DRAM devices use an active pull-up circuit and boot strapping to allow a logic "1" level of essentially Vdd to be stored in a storage capacitor. The basic concept of boosting wordlines may also advantageously be incorporated into VLSI DRAM design such as in the case of a 16 megabit DRAM.

When VLSI DRAMS having boosted word lines are produced, the maximum logic "1" that may be written into a storage cell is the level to which the bit lines are restored. If a word line has leakage on it, the maximum logic "1" that may be written into the storage cell is reduced. For example, assume this restore level has a value of about +3.3 v, a typical value for 16 megabit DRAMs, and that the word lines are boosted to about +5.0 v. If a word line has leakage, the voltage on it will fall below +5.0 v. Assume that a word line leaks down to about +3.5 v. At this level, if the DRAM is tested during the RAS cycle above described, the maximum logic "1" that can be written to an addressed memory cell on that word line will only be about +2.3 v. As those knowledgeable in the art of DRAM design are aware, this is a dangerously low logic "1" level and can cause problems. If the wordline leakage is severe enough, it becomes impossible to write a logic level "1" into a memory cell towards the end of the RAS cycle.

It is an object of this invention to detect voltage leakage in the word lines and in the memory cells, through their transfer transistor devices, of memory devices.

It is a further object of this invention to increase the speed at which DRAMs may be tested for high resistance leakage.

Other objects and advantages will be apparent to those of ordinary skill in the art having reference to the following specification together with the drawings.

SUMMARY OF THE INVENTION

A circuit, device, and method to detect voltage leakage is disclosed. The circuit includes a sample and hold circuit that is connected to the word line of an addressed memory cell to store the voltage level on the word line as it charges. A comparator is connected to the word line and to the sample and hold circuit to compare the stored voltage level with the voltage level on the word line after it is charged and to indicate if the voltage of the word line falls below a predetermined amount. The circuit can be incorporated into a random access memory device thereby significantly increasing the speed at which all memory cells and word lines can be tested. The method discloses a process for testing word line and memory cell leakage.

DETAILED DESCRIPTION OF THE PREFERRED EMBODIMENT

Figure 1:
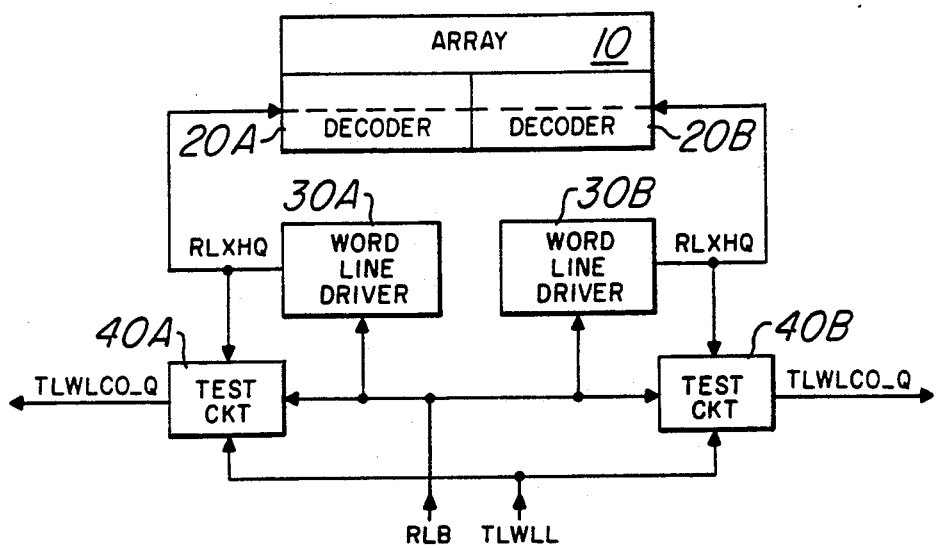
FIG. 1 is a partial block diagram of a dynamic random access memory chip.

FIG. 1 is a partial block diagram of a dynamic random access memory (DRAM) chip incorporating the invention. For clarity, all of the standard operative components and signals of the DRAM are not shown. Illustrated are memory array 10, decoders 20A and 20B, word line drivers 30A and 30B, and test circuits 40A and 40B. Test circuits 40A and 40B are each the preferred embodiment of the invention.

Memory array 10 of FIG. 1 contains memory cells that are connected by transfer transistor devices at the intersection of bit lines and word lines and are operatively arranged in rows and columns so that they are accessable in response to memory address signals. The word lines in memory array 10 can be boosted or nonboosted although the preferred embodiment uses boosted word lines. Of course, there can be more than one memory array 10 on a DRAM chip. Memory array 10 could represent one quadrant of memory containing approximatly four million memory cells in a 16 mega bit DRAM. Decoder 20A accesses one half of array 10 and similiarly, decoder 20B accesses the other half of array 10. Line RLXHQ from word line driver 30A to decoder 20A connects word line driver 30A to the word line of an accessed memory cell and line RLXHQ from word line driver 30B to deocder 20B connects word line driver 30B to the word line of an accessed memory cell. In a 16 mega bit DRAM, there could be eight such word line drivers and decoders, two for each memory array quadrant.

Test circuit 40A of FIG. 1 hangs off line RLXHQ between word line driver 30A and decoder 20A to test for voltage leakage during the RAS cycle test. Test circuit 40 A and word line driver 30A receive signals RLB and TLWLL from the timing and control circuit, not shown, of the DRAM. Signals RLB and TLWLL are used in the leakage testing operation. Test circuit 40A, when enabled, is operative to generate signal TLWLCO$_{13}$Q that indicates whether or not voltage leakage occurs on an addressed word line. Test circuit 40B is similiarly connected off signal RLXHQ from word line 30B to test for voltage leakage.

Figure 2:
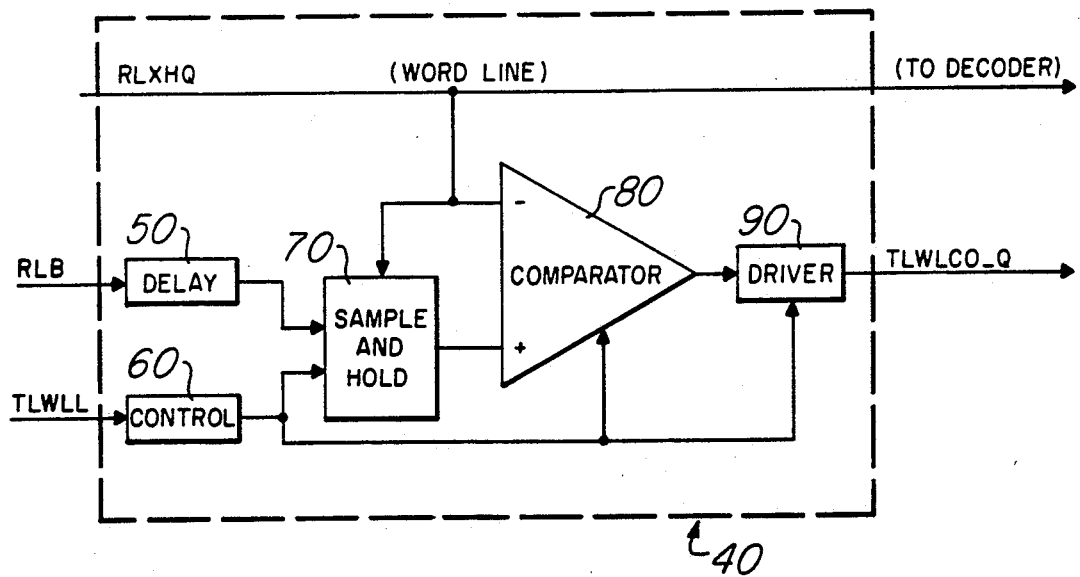
FIG. 2 is a block diagram of the preferred embodiment of the invention.

FIG. 2 is a block diagram of test circuit 40A. Test circuit 40A contains a delay circuit 50, a test control circuit 60, a sample and hold circuit 70, a comparator 80 and a driver 90.

Delay circuit 50 of FIG. 2 receives signal RLB and is connected to sample and hold circuit 70. Signal RLB serves two purposes for the leakage test operation. It turns off a component of sample and hold circuit 70, after it has been delayed by delay circuit 50, to complete the sample of the word line voltage. It also turns off the drive to the word line after it is fully charged, thereby isolating the word line so that it no longer receives any active source of charge.

Control circuit 60 of FIG. 2 receives signal TLWLL. When the leakage test operation is run in production, the DRAM memory device is put into internal test mode and the timing and control circuity of the DRAM generates signal TLWLL. Incorporated herein by reference is the article by the inventor, McAdams, and others appearing in IEEE Journal of Solid State Circuits, Vol. SC-21. No. 5, October 1986, entitled "A 1-Mbit CMOS Dynamic RAM With Design-For Test Functions". Signal TLWLL, after passing through the test control circuit 60, enables test circuit 40A so that a sampling and comparison of the word line voltage occurs.

Sample and hold circuit 70 of FIG. 2 is connected to line RLXHQ to detect the voltage on an enabled word line. Control circuit 60, upon receiving an active signal TLWLL, turns on sample and hold circuit 70 so that it begins to monitor and detect the voltage on the enabled word line as it charges. Delay circuit 50, after receiving an active signal RLB, turns off a component of sample and hold circuit 70 so that the voltage level of the charged word line is stored.

Comparator 80 of FIG. 2 is connected to line RLXHQ to receive the enabled word line voltage as one input. The other input to comparator 80 is the sampled word line voltage from sample and hold circuit 70. As will be explained later herein, in the long RAS test operation, comparator 80 is set to one state. It then compares the isolated word line voltage to the sampled word line voltage. If leakage occurs on the isolated word line, or in the memory cell through its transfer transistor that is connected to the isolated word line, the voltage on the isolated word line drops below that of the sampled word line voltage. If the voltage drop is large enough, the comparator switches and generates a signal indicating that leakage has occured. The output of control circuit 60 is also connected to enable comparator 80.

Driver 90 of FIG. 2 receives the output signal of comparator 80. Driver 90 provides the necessary drive to the output signal of comparator 80, enabling it to be read as output signal TLWLCO$_{13}$Q. Driver 90 is enabled via its connection to the output of test and control circuit 60.

Figure 3:
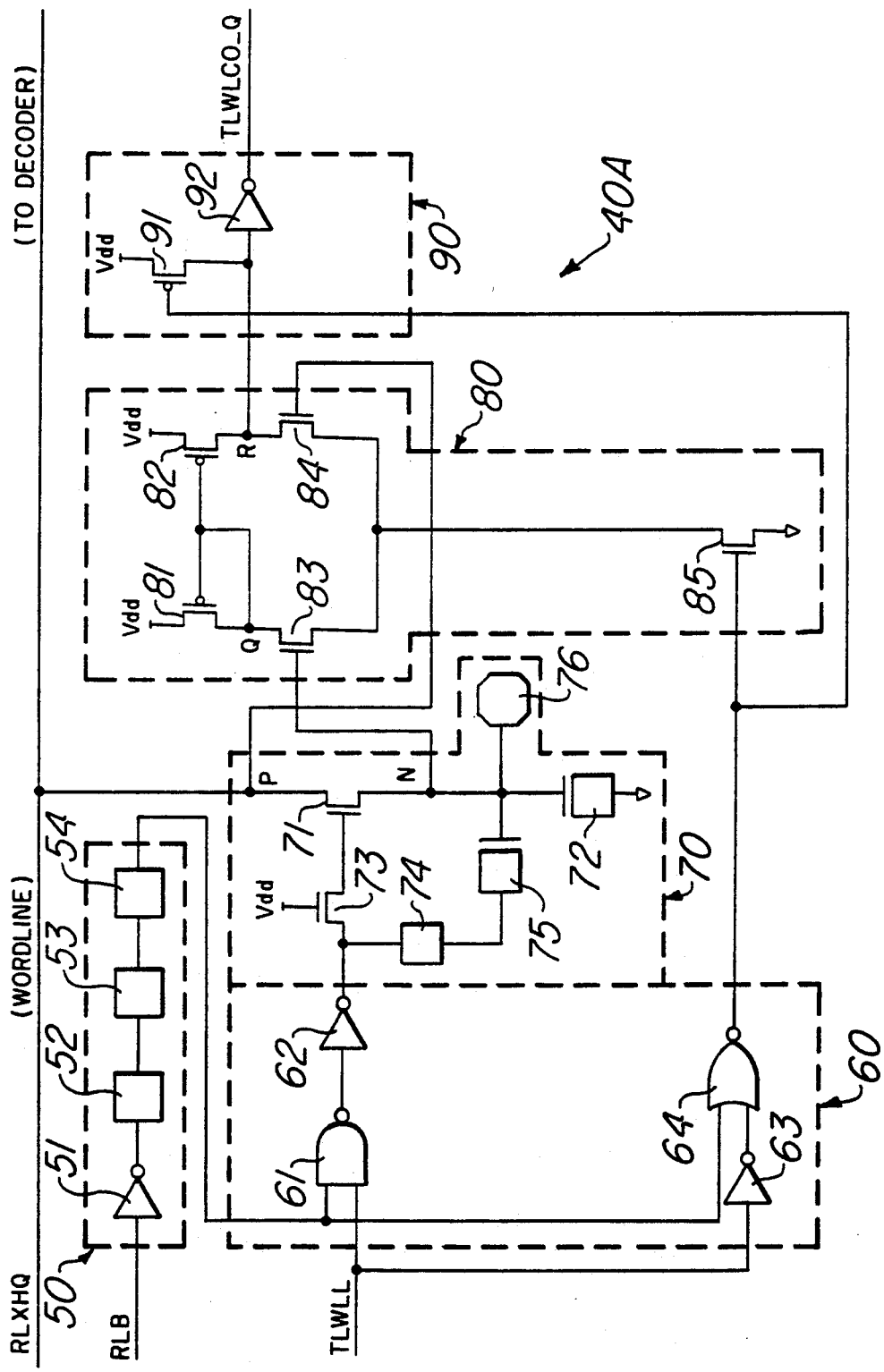
FIG. 3 is an electrical schematic diagram of the preferred embodiment of the invention.

FIG. 3 is an electrical schematic diagram of test circuit 40A.

Delay circuit 50 is formed of an inverter 51 that receives signal RLB and cascaded delay stages 52 through 54. It is well known in the art of integrated circuit design how to construct a delay stage.

Control circuit 60 of FIG. 3 is formed of a NAND gate 61, inverters 62 and 63, and a NOR gate 64. NAND gate 61 receives the output of delay circuit 50 and receives signal TLWLL. Inverter 62 receives the output of NAND gate 61. Inverter 63 receives signal TLWLL. NOR gate 64 receives the output of inverter 63 and the output of delay circuit 50.

Sample and hold circuit 70 is formed of n-channel pass transistor 71, sample capacitor 72, n-channel transistor 73, programmable switch 74, capacitor 75, and probe pad 76. The source of n-channel pass transistor 71 is connected to line RLXHQ at node P. The drain of n-channel bit pass transistor 71 is connected to one side of sample capacitor 72 at node N. The other side of sample capacitor is connected to ground. The gate of n-channel pass transistor 71 is connected to the drain of n-channel transistor 73. The gate of n-channel transistor 73 is connected to the internally supplied Vdd voltage source of +4.0 v. The source of n-channel transistor 73 is connected to the output of inverter 62 of control circuit 60. Also connected to the output of inverter 62 is one side of programmable switch 74. Programmable switch 74 may be set so that it is opened or closed. The other side of programmable switch 74 is connected to one side of capacitor 75. The other side of capacitor 75 is connected to node N. Also connected to node N is probe pad 76. Probe pad 76 is used for receiving a probe that may be used in "debugging" a leaky word line, should one exist. The voltage of an enabled word line is at node P. The sampled word line voltage is at node N.

Comparator 80 of FIG. 3 is formed of p-channel transistors 81 and 82, and, n-channel transistors 83, 84, and 85. Comparator 80 is configured according to conventional techniques, with the n-channel MOS differential amplifier of transistors 83 and 84 having a current mirror active load of p-channel transistors 81 and 82. Signal RLXHQ is connected to one side of comparator 80 via its connection to the gate of n-channel transistor 84 at node P. The sampled word line voltage is connected to the other side of comparator 80 via its connection to the gate of n-channel transistor 83 at node N. The source of n-channel transistor 85 is connected to ground while its drain is connected to the sources of n-channel transistors 83 and 84. P-channel transistor 81 has its source biased at Vdd and has its drain connected to the drain of n-channel transistor 83 at node Q. Similiarly, p-channel transistor 82 has its source biased at Vdd and has its drain connected to the drain of n-channel transistor 84 at node R. The gates of p-channel transistors 81 and 82 are connected together and are connected to node Q. The drains of p-channel transistor 82 and n-channel transistor 84 are connected to a node R. The output of comparator 80 is taken at node R.

In comparator 80, the sizes of certain transistor pairs are preferably well matched to enhance its performance. It is desirable that the channel width to channel length ratios of p-channel transistors 81 and 82 be matched. It is desirable that the channel width to channel length ratios of n-channel transistors 83 and 84 be matched. The size of the channel length of n-channel transistor 85 is such that it acts as a current source. By choosing the sizes to the transistors, comparator 80 can be set to detect various voltage differentials between nodes P and N. Accordingly, the level of voltage necessary to cause comparator 80 to flip can be set. With the transistors having the following channel width and length sizes, comparator 80 can be set to detect a 50 millivolt differential between the isolated word line voltage level and the sampled word line voltage level:

| Transistor | Channel Width | Channel Length |
| --- | --- | --- |
| 81 | 10 microns | 10 microns |
| 82 | 10 microns | 10 microns |
| 83 | 10 microns | 3 microns |
| 84 | 10 microns | 3 microns |
| 85 | 5 microns | .8 microns |

Driver 90 of FIG. 3 is formed of a p-channel pull-up transitor 91 and an inverter 92. The source of p-channel pull-up transistor 91 is biased at Vdd. The output of control circuit 60 drives the gate of p-channel pull up transistor 91. The drain of p-channel pull up transistor is connected to the input of inverter 92 at node R. The output of inverter 92 is the output of test circuit 40A, signal TLWLCO$_{13}$Q.

Figure 4:
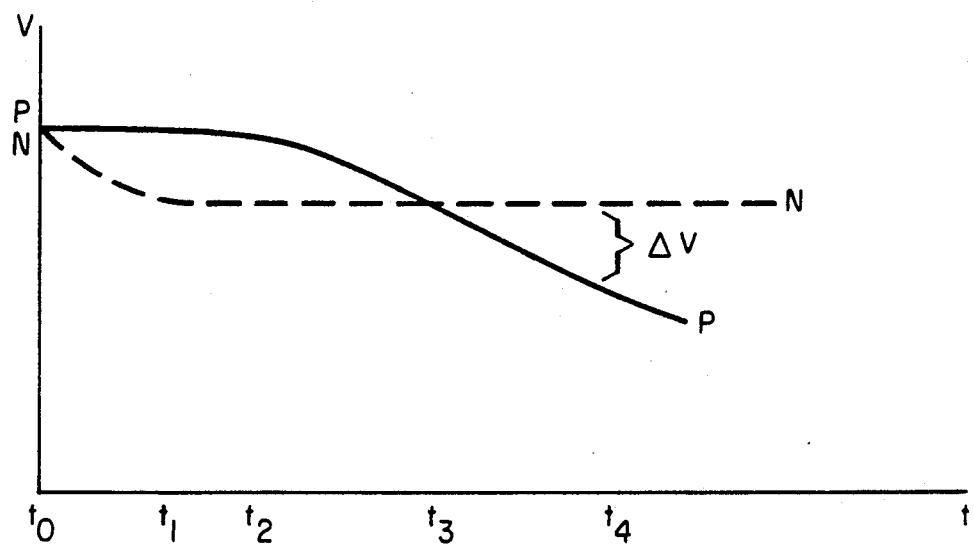
FIG. 4 is a timing diagram illustrating the operation of the invention.

By reference to the timing diagram illustrated in FIG. 4, the operation of test circuit 40A will be described.

Previous to time t0, a decision is made to test the memory device for voltage leakage in the transfer transistors of its memory cells and in its word lines. A RAS signal is generated by the DRAM timing and control circuitry so that data of a logic "0" voltage level can be written into an addressed memory cell. The word line connected to the addressed memory cell is enabled so that it begins to charge. Line RLXHQ, through decoder 20A, provides the charge from word line driver 30A to the word line. Node P therefore reflects the voltage level of the enabled word line as it charges.

Previous to time t0 when the internal DRAM test is initialized the DRAM timing and control circuitry drives signal TLW high. TLWLL stays high throughout the test. Signal RLB is generated for each word line access. With signal TLWLL high and signal RLB low, sample and hold circuit 70 is enabled and comparator 80 is disabled. (When signal RLB goes high, the sampling is completed and the comparator is enabled.) Thus, previous to time t0, the test is begun. A RAS signal is generated and TLWLL is driven high. A memory address signal is generated and the corresponding word line charges. Timing and control circuit 60 outputs a logic "1" to the source of n-channel transistor 73. This drives the gate of n-channel pass transistor 71 towards Vdd, turning on sample and hold circuit 70, so that nodes P and N follow the charging enabled word line.

Sample and hold circuit 70 is self booting so that with n-channel pass transistor 71 on, the voltage on node P passes through pass transistor 71 to sample capacitor 72. Sample capacitor 72 then holds node N to the inital voltage level of node P, the voltage level on the enabled charged wordline. Thus at time t0 in FIG. 4, nodes P and N are charged at the same voltage level—that of the corresponding word line to the addressed memory cell that the data of logic "0" voltage level is written into.

At time t0, signal RLB, having been delayed, arrives at the input of NAND gate 61 of test control circuit 60. Complemented signal RLB, of logic "0" value, passes to the gate of n-channel pass transistor 71 and turns it off to complete the voltage sample. (Because the word lines in DRAMs are polysilicon, they contain a natural amount of resistance and capacitance. All of the word line does not charge at the same rate—the end of the word line, fartherest away from the driving source, charges slower and reaches the charged voltage potential last. Therefore, to ensure that the voltage sample taken at node N represents the voltage level on a fully charged word line, signal RLB is delayed until all of the transients have died out and the whole word line is fully charged.) With pass transistor 71 off, nodes P and N are separate with the voltage on node N being held by sample capacitor 72.

Signal RLB, as indicated earlier, also disconnects word line driver 30A from line RLXHQ. This isolates the enabled wordline so that it no longer receives any active source of charge. Thus the enabled word line floats at the charged voltage level. If no leakage exists, the voltage on the wordline will not fall due to the logic "0" written in the addressed memory cell or to leakage to other adjacent word word lines. Immediately after time t0, the voltage at node N is pulled down slightly so that at time t1 it is at a fixed value that is lower than the voltage on node P. (In FIG. 4, the voltage on node P is represented by the solid line and the voltage on node N is represented by the dashed line.) The voltage pull down on node N occurs through the gate to drain capacitance of transistor 71. With the voltage of node P on the gate of n-channel transistor 84 and the voltage of node N on the the gate of n-channel transistor 83, pulling node N down creates a voltage offset that sets comparator 80. Since the voltage of node N on the gate of n-channel transistor 83 is less than the voltage of node P on the gate of n-channel transistor 84, the current through the drain/drain connection of p-channel transistor 82 and n-channel transistor 84 at node R is greater than the current through the drain/drain connection of p-channel transistor 81 and n-channel transistor 83 at node Q. Consequently, the voltage at node R falls. Inverter 92 complements the falling voltage at node R so that output signal TLWLCO$_{13}$Q is high. Accordingly, immediately after time t0, the output signal TLWLCO$_{13}$Q is high. If no voltage leakage exist, the output signal TLWLCO$_{13}$Q remains high.

However, if leakage exist on the enabled isolated word line, or o the transfer device of the addressed memory cell connected to it, the voltage on node P begins to fall. The falling voltage on node P occurs in FIG. 4 at time t2. If the leakage is severe enough, the voltage on node P continues to fall past time t3, when the voltage on nodes P and N are equal. As indicated above, the sizes of the transistors in comparator 80 have been chosen so that a voltage differential of approximately 50 millivolts in nodes P and N is necessary to cause the comparator to flip. If the voltage on node P continues to fall so that a voltage differential of approximately 50 millivolts exist, as indicated at time t4, comparator 80 switches and output signal TLWLCO$_{13}$Q is driven low. With the falling voltage of node P on the gate of n-channel transistor 84 less than the voltage of node N on the gate of n-channel transistor 83, the current through the drain/drain connection of p-channel transistor 81 and n-channel transistor 83 at node Q is greater than the current through the drain/drain connection of p-channel transistor 82 and n-channel transistor 84 at node R. Consequently, the voltage at node R rises rapidly. Inverter 92 complements the rising voltage at node R. The output signal $TLWLCO_{13}Q$ is driven low, indicating that leakage has occurred.

Programmable switch 74 of sample and hold circuit 70 of FIG. 3 provides flexibility in creating further inital voltage offset in nodes P and N to set comparator 80. In FIG. 3, programmable switch 74 is illustrated in the open condition, hence, the inital voltage offset of node N occurs through transistor 71. However, by closing programmable switch 74, capacitor 75, connected to node N also couples voltage off sample capacitor 72 so that the offset voltage at node N is larger.

The test circuit and the sample and hold comparison technique above described enables a powerful and speedy RAS cycle test of a DRAM. It is calculated that the RAS cycle test time is reduced from approximately 10 microseconds per memory cell, to approximately 200 nanoseconds per memory cell. Test circuit 40A can detect a 50 millivolt differential in approximately 200 nanoseconds. In a VLSI DRAM device, such as in 16 megabit DRAMs and larger DRAMs, the time savings is dramatic. For example, the time to detect a leaky word line or memory cell transfer device (for a high resistance short on the order of about 2 megaohms) in a 16 megabit DRAM decreases from approximately 160 seconds to approximately 3.2 seconds. Because the overall test time for the chip is greatly reduced, the RAS cycle test time can be extended, thus allowing for higher levels of shorting resistance to be tested without jeopardizing the memory production schedule. By choosing the sizes of the transistors in comparator 80 and by closing the programmable switch, the voltage differential necessary to cause comparator 80 to switch can be changed, thereby also enabling different levels of high resistance to be tested.

Although the invention has been described in detail herein with reference to its preferred embodiment, it is to be understood that this description is by way of example only, and is not to be construced in a limiting sense. It is to be further understood that numerous changes in the details of the embodiment of the invention, and additional embodiments of the invention, will be apparent to, and may be made by persons of ordinary skill in the art having reference to this description. It is contemplated that such changes and additional embodiments are within the spirit and true scope of the invention as claimed below.

What is claimed is:

1. A test circuit to test for voltage leakage on word lines, that are charged when memory cells in a memory device are addressed, and to test for voltage leakage of the transfer devices of the addressed memory cells comprising:

a sample and hold circuit connected to the word line of an addressed memory cell to store the voltage level on the word line a the word line charges; and a comparator connected to the word line and connected to the sample and hold circuit, to compare the stored voltage level with the voltage level on the word line after the word line is charged and to indicate if the voltage level of the word line falls below a predetermined amount.

2. The test circuit of claim 1 wherein the sample and hold circuit includes:

a pass transistor to transfer the voltage on the word line as it charges; and a capacitor to store the transferred voltage.

3. The test circuit of claim 2 further comprising:

a decoupling circuit connected to the word line and to the pass transistor to decouple the word line from any active voltage source once the word line is charged and to turn off the pass transistor once the word line is charged.

4. The test circuit of claim 3 wherein the predetermined amount ranges between about 25 to 50 millivolts.

5. An integrated circuit random access memory device, comprising:

a memory array having memory cells, word lines and bit lines, the memory cells operatively arranged in rows and columns and connected by transfer devices at the intersection of word lines and bit lines so that they correspond to memory addresses and are addressable;

a word line driver to charge a word line when a memory cell is accessed;

a decoder connected to the word line driver and to the memory array to decode address signals and to connect the word line driver to the word line of the addressed memory cell; and a test circuit coupled to the word line driver and the decoder to test for voltage leakage on the word line and transfer device of the addressed memory cell, comprising:

a sample and hold circuit to store the charged voltage of the word line;

a decoupling circuit to decouple the charged word line from the word line driver; and a comparator to compare the charged stored voltage with the voltage on the decoupled word line and to indicated if the voltage on the decoupled word line drops below a predetermined amount.

6. The integrated circuit random access memory device of claim 5 wherein the sample and hold circuit includes:

a pass transistor to transfer the voltage on the driven word line, and a capacitor connected to the pass transistor to receive the voltage.

7. The integrated circuit random access memory device of claim 6 wherein the predetermined amount ranges between approximately 25 to 50 millivolts.

8. The integrated circuit random access memory device of claim 5 wherein the predetermined amount is from about 25 to 50 millivolts.

9. The integrated circuit random access memory device of claim 5 wherein the word lines are boosted word lines.

10. A method to test for leakage in word lines and transfer devices of memory cells in an integrated circuit random access memory device having a plurality of memory cells and word lines comprising the steps of:

generating an address signal;

driving the word line of the memory cell, that corresponds to location of the address signal, to a voltage level;

sampling the driven voltage level of the word line;

isolating the word line;

comparing the sampled driven voltage level to the voltage level on the isolated word line; and generating a signal if a voltage differential in excess of a predetermined amount occurs.

11. The method of claim 10 wherein the steps are repeated so that all memory cells of the random access memory device are addressed, thereby testing all transfer devices and all word lines for leakage.

* * * * *

UNITED STATES PATENT AND TRADEMARK OFFICE
CERTIFICATE OF CORRECTION

PATENT NO. : 5,117,426

DATED : May 26, 1992

INVENTOR(S) : Hugh P. McAdams, Dan Cline

It is certified that error appears in the above-identified patent and that said Letters Patent is hereby corrected as shown below:

On the title page, under item [19] after "McAdams" insert --et al.--; and in item [75] should be changed to read as follows:

--Hugh P. McAdams, Houston; Dan Cline, Plano, both of Tex.--.

Signed and Sealed this

Thirteenth Day of July, 1993

Attest:

MICHAEL K. KIRK

*Attesting Officer*     *Acting Commissioner of Patents and Trademarks*